United States Patent [19]
Ishida

[11] Patent Number: 5,742,206
[45] Date of Patent: Apr. 21, 1998

[54] GAIN CONTROL CIRCUIT AND VARIABLE GAIN POWER AMPLIFIER USING SAME

[75] Inventor: Shinji Ishida, Yokohama, Japan

[73] Assignee: Kabushiki Kaisha Toshiba, Kanagawa-ken, Japan

[21] Appl. No.: 717,275

[22] Filed: Sep. 20, 1996

[30] Foreign Application Priority Data

Sep. 21, 1995 [JP] Japan ................. 7-243049

[51] Int. Cl.6 ........................... H03G 3/30
[52] U.S. Cl. ........................... 330/284; 330/145
[58] Field of Search ................. 330/144, 145, 330/279, 284

[56] References Cited

U.S. PATENT DOCUMENTS 5,327,101  7/1994  Neely et al. ................. 330/284

Primary Examiner—James B. Mullins
Attorney, Agent, or Firm—Finnegan, Henderson, Farabow, Garrett & Dunner, L.L.P.

[57] ABSTRACT

A gain control circuit (200) for controlling gain of a circuit (100) operative on the basis of a positive supply voltage, in accordance with strength of current pulled out by the gain control circuit from a control node (12) of the gain-controlled circuit (100), comprises: a depletion-type transistor (21) having one end (drain) connected to the control node of the gain-controlled circuit, the other end (source) connected to a voltage supply terminal (25) to which an external supply voltage is applied, and a gate terminal connected to a control signal terminal (16) to which an external positive voltage control signal is applied; and a resistance element (22) connected in parallel to both ends of the depletion-type transistor (21), for shifting a threshold voltage of the transistor in a positive direction by applying a shift voltage between both the ends of the transistor so that turn-on resistance of the transistor can be controlled on the basis of the positive voltage control signal. Here, the gain of the gain-controlled circuit (100) can be controlled by controlling strength of current pulled out from the gain-controlled circuit on the basis of the positive voltage control signal applied to the gate terminal of the transistor (21).

18 Claims, 13 Drawing Sheets

GAIN CONTROL CIRCUIT AND VARIABLE GAIN POWER AMPLIFIER USING SAME

BACKGROUND OF THE INVENTION

1. Field of the Invention

The present invention relates to a gain control circuit, and a variable gain power amplifier using the same gain control circuit, and more specifically to a variable gain high-frequency power amplifier using the same gain control circuit.

2. Description of the Background

A variable gain high-frequency power amplifier related to the present invention will be explained hereinbelow with reference to FIG. 7. In FIG. 7, the power amplifier is roughly composed of a high-frequency power amplifier circuit 100 and a gain control circuit 200 connected to the high-frequency power amplifier circuit 100 for control of the gain of the power amplifier circuit 100. Here, although the power amplifier circuit 100 is well known, the gain control circuit 200 is not known in the art but known only by the inventors.

As shown in FIG. 7, the high-frequency power amplifier circuit 100 includes an input matching circuit 2 connected to an external input terminal 1, a depletion-type MESFET (metal semiconductor field effect transistor) 3 having a gate connected to the input matching circuit 2 and a grounded source (which constructs a first amplifier stage 110), an inter-stage matching circuit 4 connected to a drain of the MESFET 3 via a DC block capacitor Cc1, another depletion-type MESFET 5 having a gate connected to the inter-stage matching circuit 4 and a grounded source (which constructs a second amplifier stage 120), an output matching circuit 6 connected to a drain of the MESFET 5 via another DC block capacitor Cc2 and further to an external output terminal 7, a first external voltage supply terminal 10 connected to the drain of the MESFET 3 via an inductor and a node 8 (which is AC-grounded via a bypass capacitor Cb1), and a second external voltage supply terminal 11 connected to the drain of the MESFET 5 via another inductor and a node 9 (which is AC-grounded via another bypass capacitor Cb2).

Further, the gain control circuit 200 includes a depletion-type MESFET 14 having a drain connected to a node 12 between the DC block capacitor Cc1 and the inter-stage matching circuit 4 and a grounded source (which constructs a gain control stage 210) and an external gain control terminal 16 connected to a gate of the MESFET 14 via a node 15 (which is AC-grounded via another bypass capacitor Cb3).

In FIG. 7, the gain of the variable gain high-frequency power amplifier circuit 100 can be controlled by the gain control stage 210; that is, by controlling the electric conductivity of the depletion-type MESFET 14 on the basis of the gate voltage applied to the same MESFET 14. In more detail, when the electric conductivity of the MESFET 14 is minimized, the gain of the high-frequency power amplifier circuit 100 can be maximized. In contrast with this, when the electric conductivity of the MESFET 14 is maximized, the gain of the high-frequency power amplifier circuit 100 can be minimized. As the MESFET 14 for controlling the gain of the power amplifier circuit 100, such a depletion-type MESFET is generally adopted, because the threshold voltage thereof can be controlled easily and further the electric conductivity thereof can be increased in spite of a relatively short gate width.

An example of the gain control is as follows: When a voltage of 0V is applied to the gain control terminal 16, the electric conductivity of the depletion-type MESFET 14 can be maximized, so that the gain of the high-frequency power amplifier circuit 100 can be minimized. Further, when a voltage of −3V is applied to the gain control terminal 16, the electric conductivity of the depletion-type MESFET 14 can be minimized, so that the gain of the high-frequency power amplifier circuit 100 can be maximized.

Further, the above-mentioned high-frequency power amplifier is constructed by a compound semiconductor integrated circuit including a plurality of MESFETs each formed of GaAs semiconductor. This is because the GaAs semiconductor integrated circuit has such advantages that the high-frequency characteristics are excellent and further the supply voltage is low, as compared with those of the silicon semiconductor integrated circuit, owing to the physical properties of GaAs semiconductor.

By the way, the above-mentioned high-frequency power amplifier has been so far used as a final stage amplifier of a radio transmitter. Recently, however, since the radio transmitter has been widely used as a portable radio transmitter (e.g., a portable telephone set), the radio transmitter must be small-sized, so that the simplification of the total system of the radio transmitter, that is, the simplification of the power amplifier incorporated in the radio transmitter as a part of a radio system has become severely needed.

In the related variable gain high-frequency power amplifier as shown in FIG. 7, however, a negative supply voltage is essential to control the gain of the power amplifier circuit 100. As a result, a convertor for converting a positive potential gain control signal into a negative potential gain control signal must be incorporated, thus causing a problem in that the system construction cannot be simplified.

SUMMARY OF THE INVENTION

With these problems in mind, therefore, it is a first object of the present invention to provide a gain control circuit and a variable gain high-frequency power amplifier using the same gain control circuit, which can simplify the system construction thereof.

Further, a second object of the present invention to provide a gain control circuit and a variable gain high-frequency power amplifier using the same gain control circuit, which can prevent the positive feedback oscillation thereof, without increasing the number of the external terminals.

To achieve the above-mentioned objects, the present invention provides a gain control circuit for controlling gain of a circuit operative on the basis of a positive supply voltage, in accordance with strength of current pulled out by the gain control circuit from a control node of the gain-controlled circuit, comprising: a depletion-type transistor having one end connected to the control node of the gain-controlled circuit, the other end connected to a voltage supply terminal to which an external supply voltage is applied, and a gate terminal connected to a control signal terminal to which an external positive voltage control signal is applied; and voltage applying means connected in parallel to both ends of said depletion-type transistor, for shifting a threshold voltage of said transistor in a positive direction by applying a shift voltage between both the ends of said transistor so that turn-on resistance of said transistor can be controlled on the basis of the positive voltage control signal, the gain of the gain-controlled circuit being controlled by controlling strength of current pulled out from the gain-controlled circuit on the basis of the positive voltage control signal.

Here, it is preferable that said voltage applying means is a resistance element, a voltage drop generated when current flows through said resistance element being used as the shift voltage.

Further, it is preferable that the other end of said transistor and the gate terminal of said transistor are both ac-grounded via a bypass capacitance, respectively.

Further, it is preferable that another resistance element is connected between the gate terminal of said transistor and the control signal terminal, to prevent signal from being transmitted from at least one end of said transistor to the gate terminal thereof via a floating capacitance.

Further, it is preferable that the voltage supply terminal for said transistor is used in common for a voltage supply terminal for the gain-controlled circuit.

Further, the present invention provides a variable gain signal amplifier device having an amplifier circuit and a gain control circuit for controlling gain of the amplifier circuit by controlling strength of current pulled out from a control node of the amplifier circuit, both the circuits being operative on the basis of a positive supply voltage respectively, wherein said gain control circuit comprises: a depletion-type transistor having one end connected to the control node of the amplifier circuit, the other end connected to a voltage supply terminal to which an external supply voltage is applied, and a gate terminal connected to a control signal terminal to which an external positive voltage control signal is applied; and voltage applying means connected in parallel to both ends of said depletion-type transistor, for shifting a threshold voltage of said transistor in a positive direction by applying a shift voltage between both the ends of said transistor so that turn-on resistance of said transistor can be controlled on the basis of the positive voltage control signal, the gain of the amplifier circuit being controlled by controlling strength of current pulled out from the amplifier circuit on the basis of the positive voltage control signal.

Here, it is preferable that when the amplifier circuit is constructed as a multi-stage amplifier circuit, the control node is a node provided after the first-stage amplifier.

Further, it is preferable that when each amplifier stage of the multi-stage amplifier circuit has a positive voltage supply terminal respectively, the voltage supply terminal of said transistor is connected to one of the positive voltage supply terminals of the multi-stage amplifier circuit except that of the first-stage amplifier.

Further, it is preferable that when each amplifier stage of the multi-stage amplifier circuit has a positive voltage supply terminal respectively, the voltage supply terminal of said transistor is connected to the positive voltage supply terminal of the first-stage amplifier.

DETAILED DESCRIPTION OF THE PREFERRED EMBODIMENTS

Figure 1:
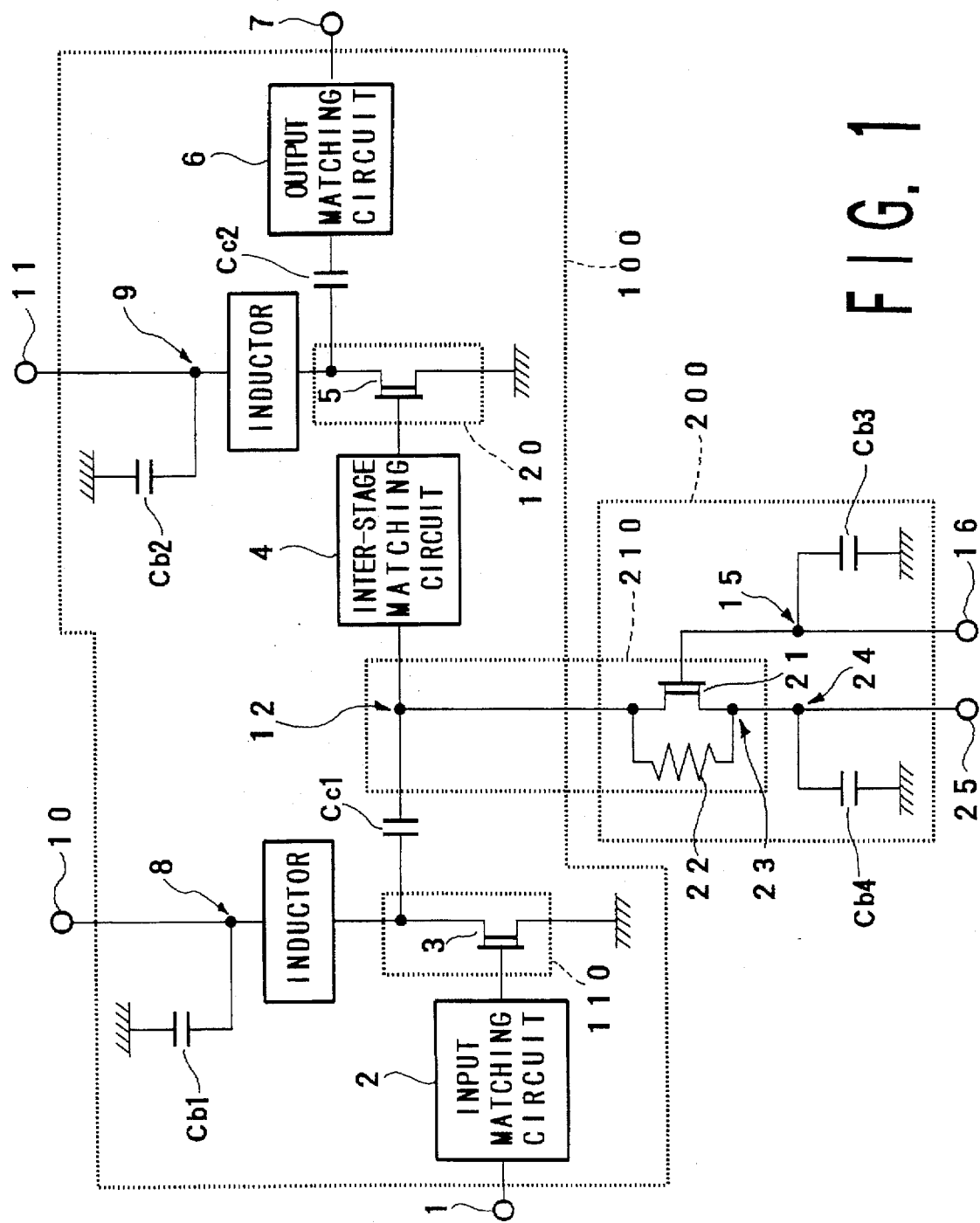
FIG. 1 is a circuit diagram showing a first embodiment of the variable gain high-frequency power amplifier according to the present invention.
Figure 1A:
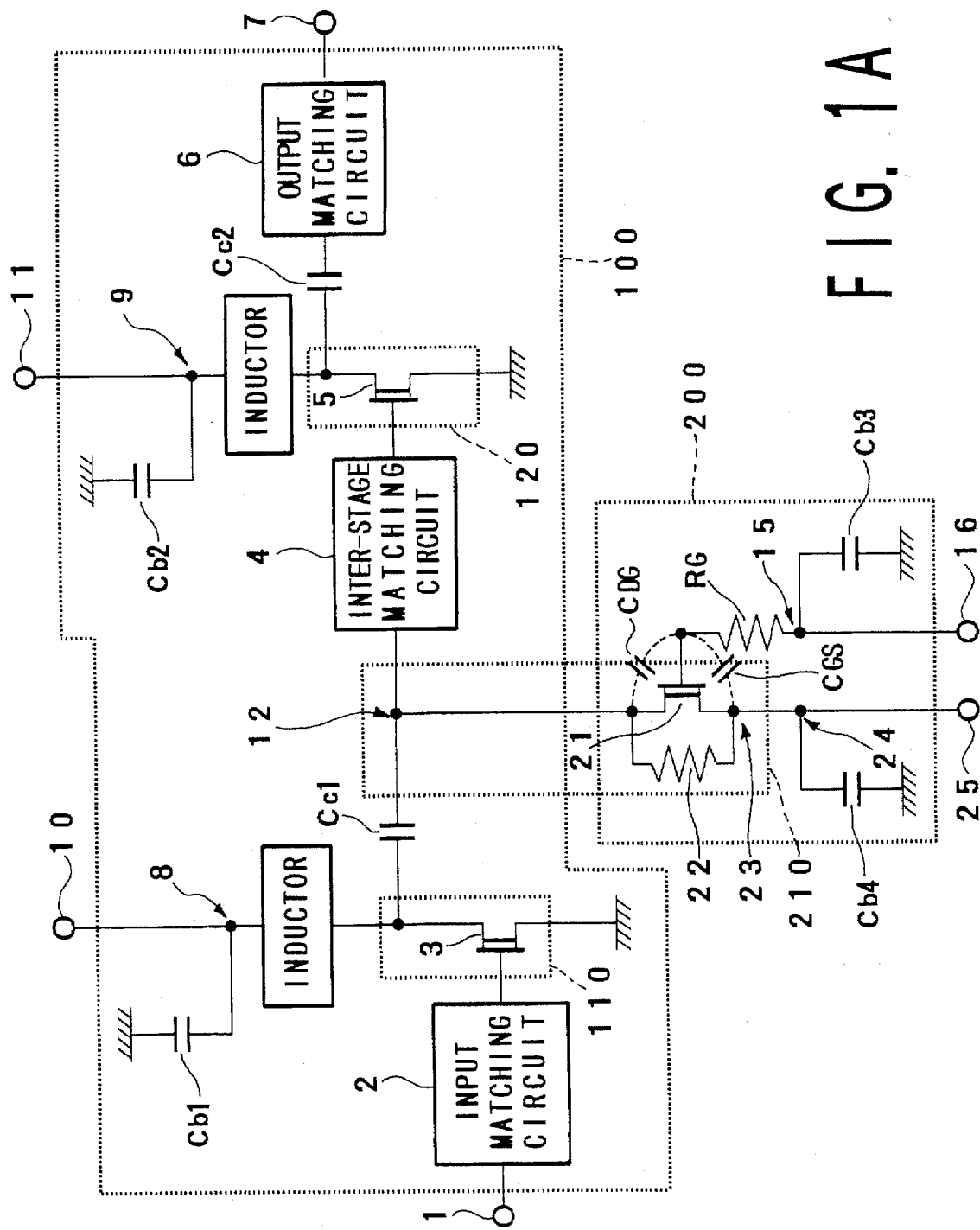
FIG. 1A is a circuit diagram showing a modification of the first embodiment of the variable gain high-frequency power amplifier according to the present invention.

Some embodiments of the variable gain high-frequency power amplifier according to the present invention will be described hereinbelow with reference to the attached drawings, in which common reference numerals have been retained for the similar elements or parts having the same functions for brevity of the explanation.

FIG. 1 shows a first embodiment thereof. As shown in FIG. 1, the variable gain high-frequency power amplifier is roughly composed of a high-frequency power amplifier circuit 100 and a gain control circuit 200 connected to the high-frequency power amplifier circuit 100 for control of the gain of the power amplifier circuit 100.

The high-frequency power amplifier circuit 100 comprises an input matching circuit 2 connected to an external input terminal 1, a depletion-type MESFET (metal semiconductor field effect transistor) 3 having a gate connected to the input matching circuit 2 and a grounded source (which constructs a first amplifier stage 110), an interstage matching circuit 4 connected to a drain of the MESFET 3 via a DC block capacitor Cc1, another depletion-type MESFET 5 having a gate connected to the inter-stage matching circuit 4 and a grounded source (which constructs a second amplifier stage 120), an output matching circuit 6 connected to a drain of the MESFET 5 via another DC block capacitor Cc2 and further to an external output terminal 7, a first external voltage supply terminal 10 connected to the drain of the MESFET 3 via an inductor and a node 8 (which is AC-grounded via a bypass capacitor Cb1), and a second external voltage supply terminal 11 connected to the drain of the MESFET 5 via another inductor and a node 9 (which is AC-grounded via another bypass capacitor Cb2). Further, in the above description, AC-grounded implies that only AC signals are grounded without grounding DC signals.

Further, the depletion-type MESFETs 3 and 5 are used as the amplifier stages 110 and 120, respectively. These depletion-type MESFETs 3 and 5 are both controlled on the basis a negative potential signal, respectively. Further, the reason why the depletion-type MESFETs are used is that the depletion-type MESFETs have such an advantage that a larger gain can be obtained, as compared with when enhancement-type MESFETs are used for the respective amplifier stages 110 and 120.

Further, any other conventional circuits can be used as the high-frequency power amplifier circuit 100, without being limited to only the circuit as shown in FIG. 1.

The gain control circuit 200 according to the present invention is so constructed as to satisfy the system simplification as follows:

The gain control circuit 200 comprises a depletion-type MESFET 21 having a drain connected to a node 12 between the DC block capacitor Cc1 and the inter-stage matching circuit 4 and a grounded source (which constructs a gain control stage 210), an external gain control terminal 16 connected to a gate of the MESFET 14 via a node 15 (which is AC-grounded via another bypass capacitor Cb3), a high resistance element 22 connected between the source and drain of the MESFET 21 as a high-frequency cutting-off element, and a third external voltage supply terminal 25 connected to a node 23 between the source of the MESFET 21 and the high resistance element 22 via a node 24 (which is AC-grounded via another bypass capacitor Cb4).

Further, the resistance value of the high resistance element 22 is set to the order of kilo-ohms (e.g., 10 kΩ).

In the variable gain high-frequency power amplifier circuit 100 as shown in FIG. 1, the gain of the power amplifier circuit 100 can be controlled by the gain control stage 210; that is, by controlling the electric conductivity of the depletion-type MESFET 21 on the basis of the voltage applied to the gate of same MESFET 21. In this case, since the high-resistance element 22 is connected between the drain and the source of the MESFET 21 (which is different from the gain control circuit 200 shown in FIG. 7), when a positive potential is applied to the terminal 25, it is possible to apply a relatively high positive potential to the drain of the MESFET 21 via the high-resistance element 22, so that it is possible to control the conductivity of the MESFET 21 by applying a positive voltage to the gate of the MESFET 21.

Therefore, for instance, when a voltage of 0V is applied to the gain control terminal 16, the electric conductivity of the depletion-type MESFET 21 can be minimized, so that the gain of the high-frequency power amplifier circuit 100 can be maximized. Further, when a voltage of +3V is applied to the gain control terminal 16, the electric conductivity of the depletion-type MESFET 21 can be maximized, so that the gain of the high-frequency power amplifier circuit 100 can be minimized.

Figure 7:
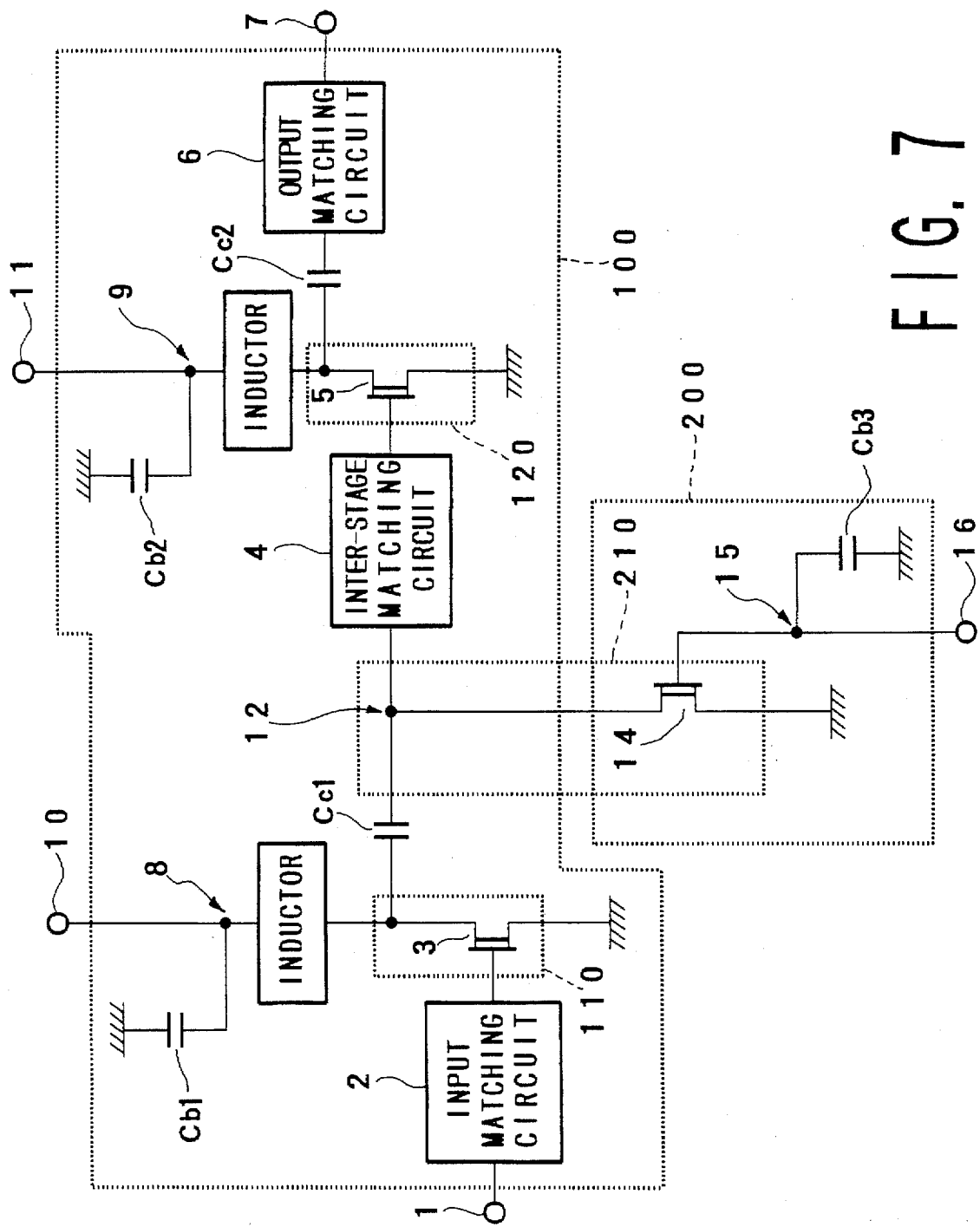
FIG. 7 is a circuit diagram showing a variable gain high-frequency power amplifier related to the present invention, in which a part thereof is well known but the remaining part thereof is not known.

As described above, in the high-frequency power amplifier as shown in FIG. 1, the gain of the power amplifier circuit 100 can be controlled by applying only a positive potential to the gate of the MESFET 21, without use of a negative potential as with the case of the circuit as shown in FIG. 7. As a result, a convertor for converting the potential of the gain control signal can be eliminated, so that the system construction can be simplified. Consequently, the size of a circuit board on which the power amplifier is mounted can be reduced, with the result that the size of the portable radio transmitter such as a portable telephone set can be also small-sized.

Figure 4:
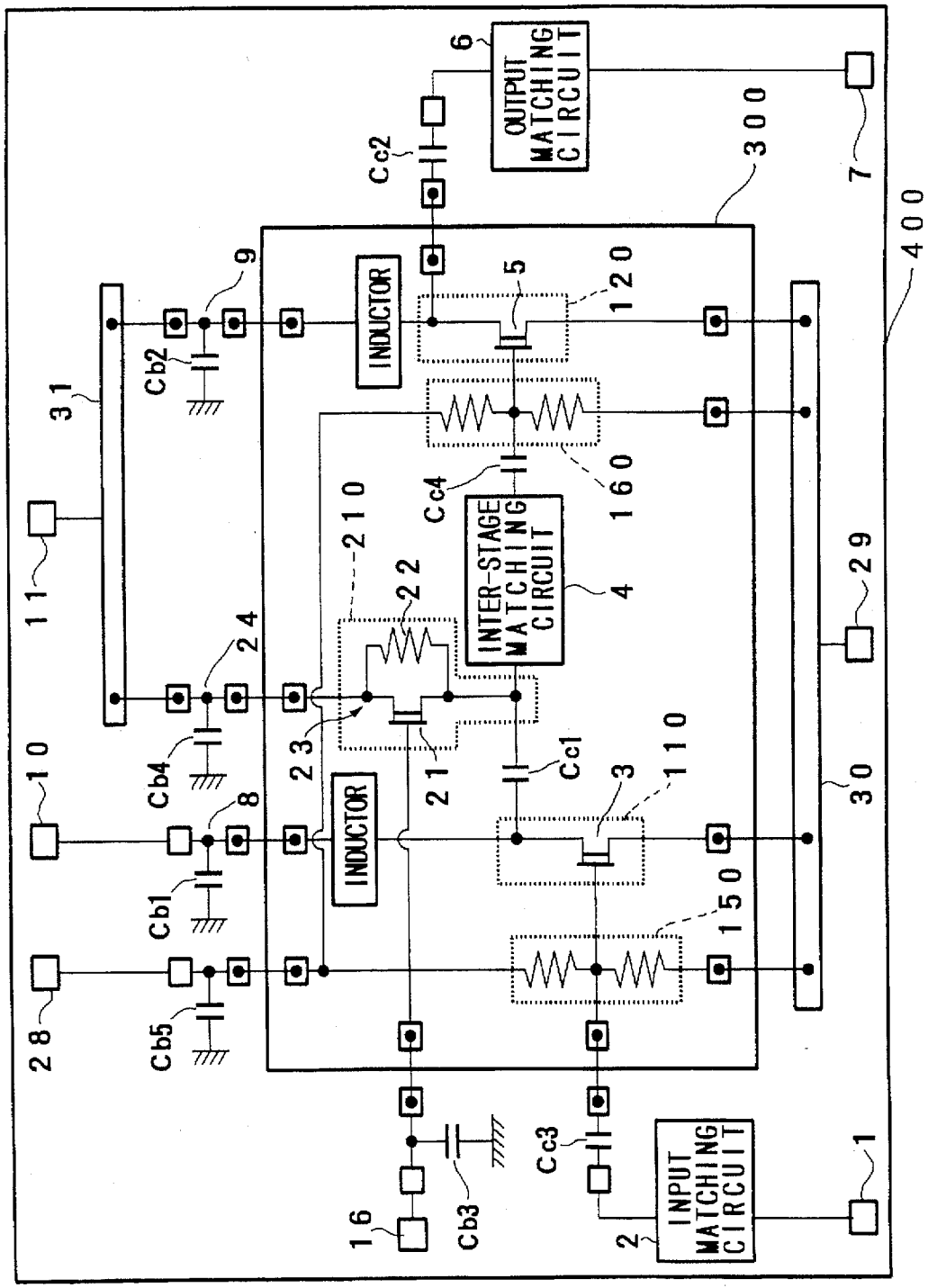
FIG. 4 is a circuit diagram showing a fourth embodiment of the variable gain high-frequency power amplifier according to the present invention.
Figure 4A:
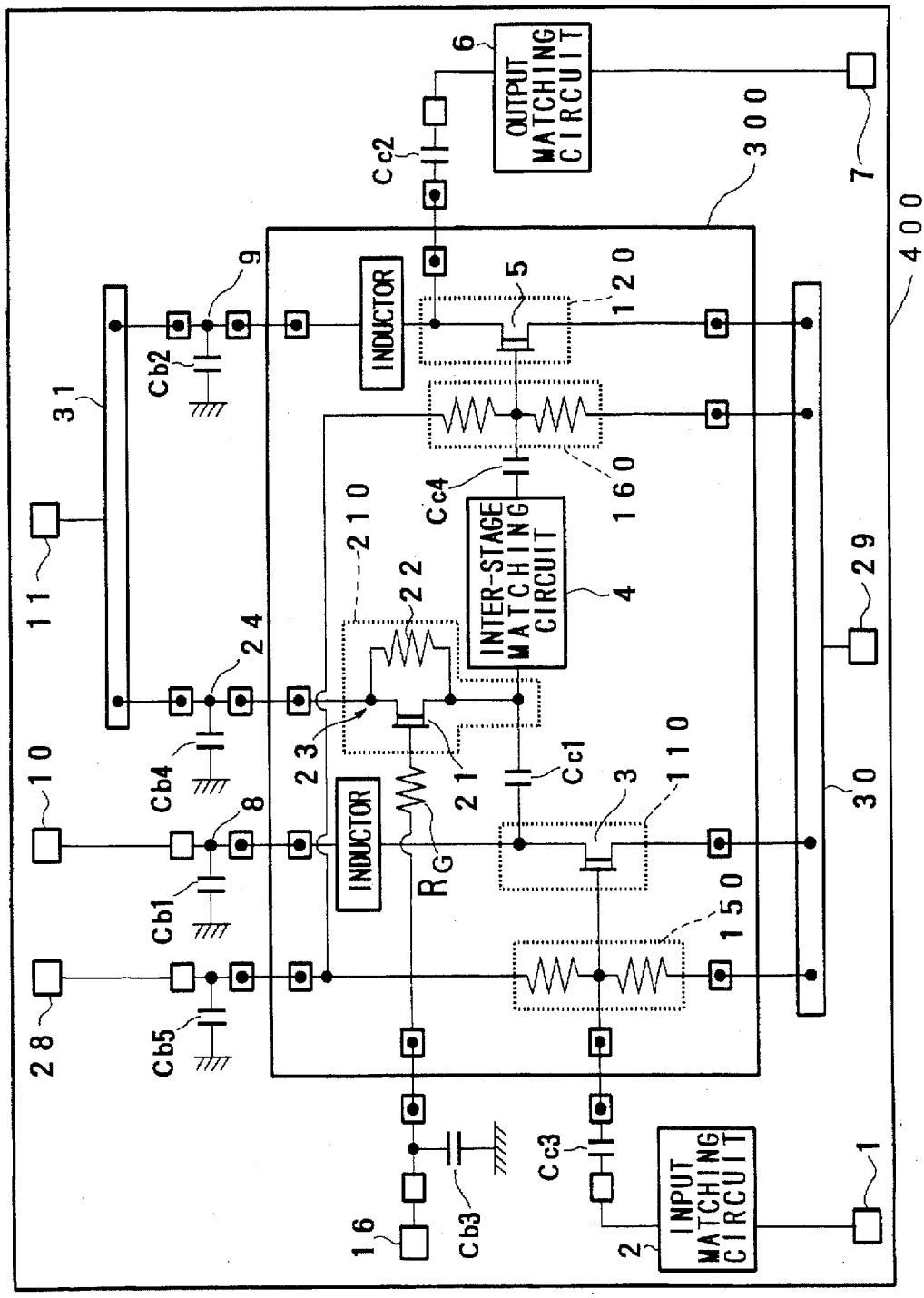
FIG. 4A is a circuit diagram showing a modification of the fourth embodiment of the variable gain high-frequency power amplifier according to the present invention.

Further, in the first embodiment of the variable gain high-frequency power amplifier as shown in FIG. 1, since the potential of the high-frequency signal inputted to the high-frequency power amplifier circuit 100 must be converted into a negative potential, another convertor (e.g., a gate bias circuit 150 as shown in FIG. 4) for converting the potential of the high-frequency signals into a negative potential is required.

In the high-frequency power amplifier as shown in FIG. 1, however, it is possible to reduce the total number of the convertors to be incorporated in the system, as compared with the circuit as shown in FIG. 7.

In addition, in the above-mentioned first embodiment of the variable gain high-frequency power amplifier, since the number of the convertors can be reduced, it is possible to decrease the number of IC parts to be mounted on a circuit board. As a result, the parts cost thereof can be also decreased, and further the assembly yield thereof can be increased at the same time, with the result that the manufacturing cost of the system can be reduced, as compared with the case shown in FIG. 7.

A second embodiment of the variable gain high-frequency power amplifier will be described hereinbelow with reference to FIG. 2.

Figure 2:
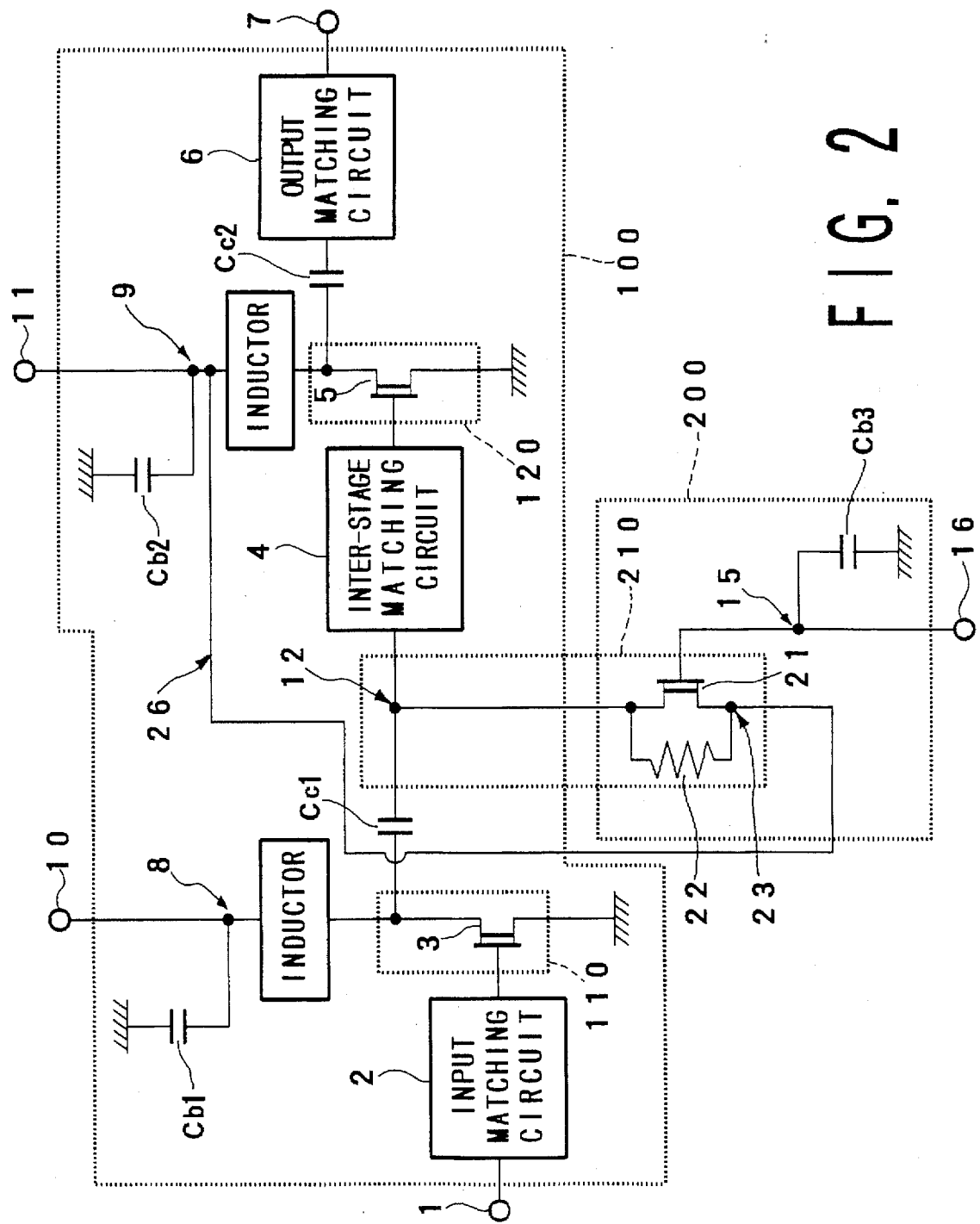
FIG. 2 is a circuit diagram showing a second embodiment of the variable gain high-frequency power amplifier according to the present invention.
Figure 2A:
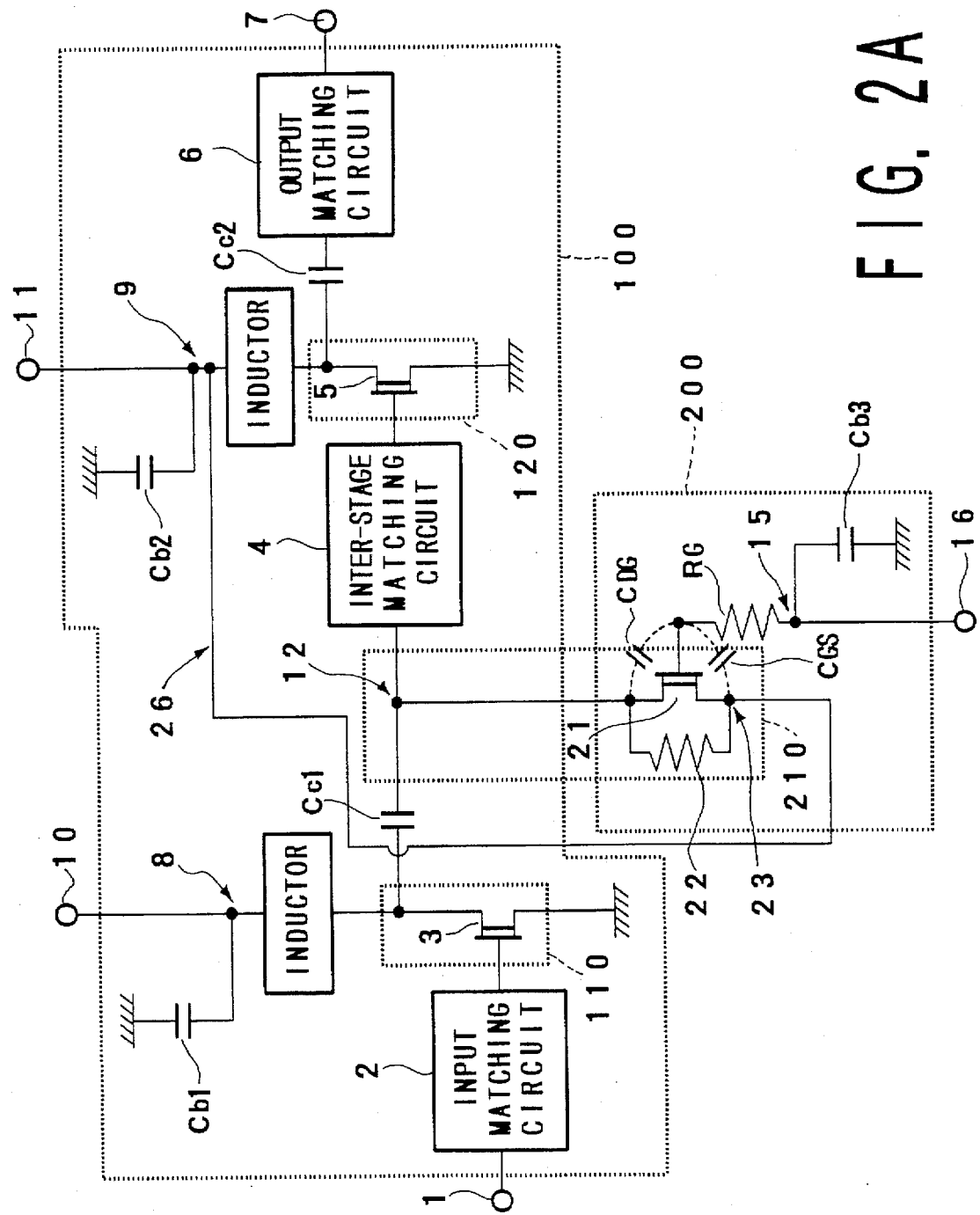
FIG. 2A is a circuit diagram showing a modification of the second embodiment of the variable gain high-frequency power amplifier according to the present invention.

As shown in FIG. 2, the second embodiment of the power amplifier according to the present invention comprises the gain control circuit 200 similar to that of the first embodiment shown in FIG. 1, to simplify the system construction. However, the gain control circuit 200 of this second embodiment is different from that of the first embodiment in that the node 23 between the source of the depletion-type MESFET 21 and the high resistance element 22 is connected to the node 9 (AC-grounded via the capacitor Cb2) through a wire 26. Therefore, the voltage supply terminal 25 (shown in FIG. 1) of the MESFET 21 can be used in common with the voltage supply terminal 11 of the MESFET 5. As a result, it is possible to eliminate the third voltage supply terminal 25, as compared with the first embodiment. In other words, in this second embodiment, it is possible to further simplify the system construction, while keeping the number of the terminals same as that of the related power amplifier (which uses a negative potential) as shown in FIG. 7.

Here, since the number of the supply voltage terminals of the simplified variable gain high-frequency power amplifier can be reduced one, it is possible to eliminate the convertor for gain control signal and simultaneously to simplify the wiring pattern of the circuit board on which the power amplifier is mounted. Therefore, the circuit board of this second embodiment can be further small-sized, as compared with that of the first embodiment.

Further, since the number of the terminals can be reduced, it is possible to reduce the contract points between the power amplifier and the circuit board, so that the assembly thereof and thereby the assembly yield thereof can be both further simplified, as compared with those of the first embodiment.

Further, it is also possible to reduce the number of the voltage supply terminals of the MESFET 21 by connecting the voltage supply terminal 25 of the MESFET 21 in common with the voltage supply terminal 10 of the MESFET 3. In this case, however, since the output power of the MESFET 3 is connected to the ground via the gain controlling MESFET 21, the gain of the power amplifier is limited. In addition, when the voltage supply terminal of the MESFET 21 and the voltage supply terminal 10 of the MESFET 3 are used in common, the output power of the MESFET 3 is returned to the voltage supply terminal of the same MESFET 3 through a positive feedback loop, so that there exists the case where the circuit is oscillated.

Therefore, in this second embodiment, the circuit can be prevented from being oscillated by using the voltage supply terminal of the MESFET 21 in common with the voltage supply terminal 11 of the MESFET 5. Therefore, it is possible to reduce the number of the terminals of the variable high-frequency power amplifier, while simplifying the system construction.

A third embodiment of the variable gain high-frequency power amplifier will be described hereinbelow with reference to FIG. 3.

Figure 3:
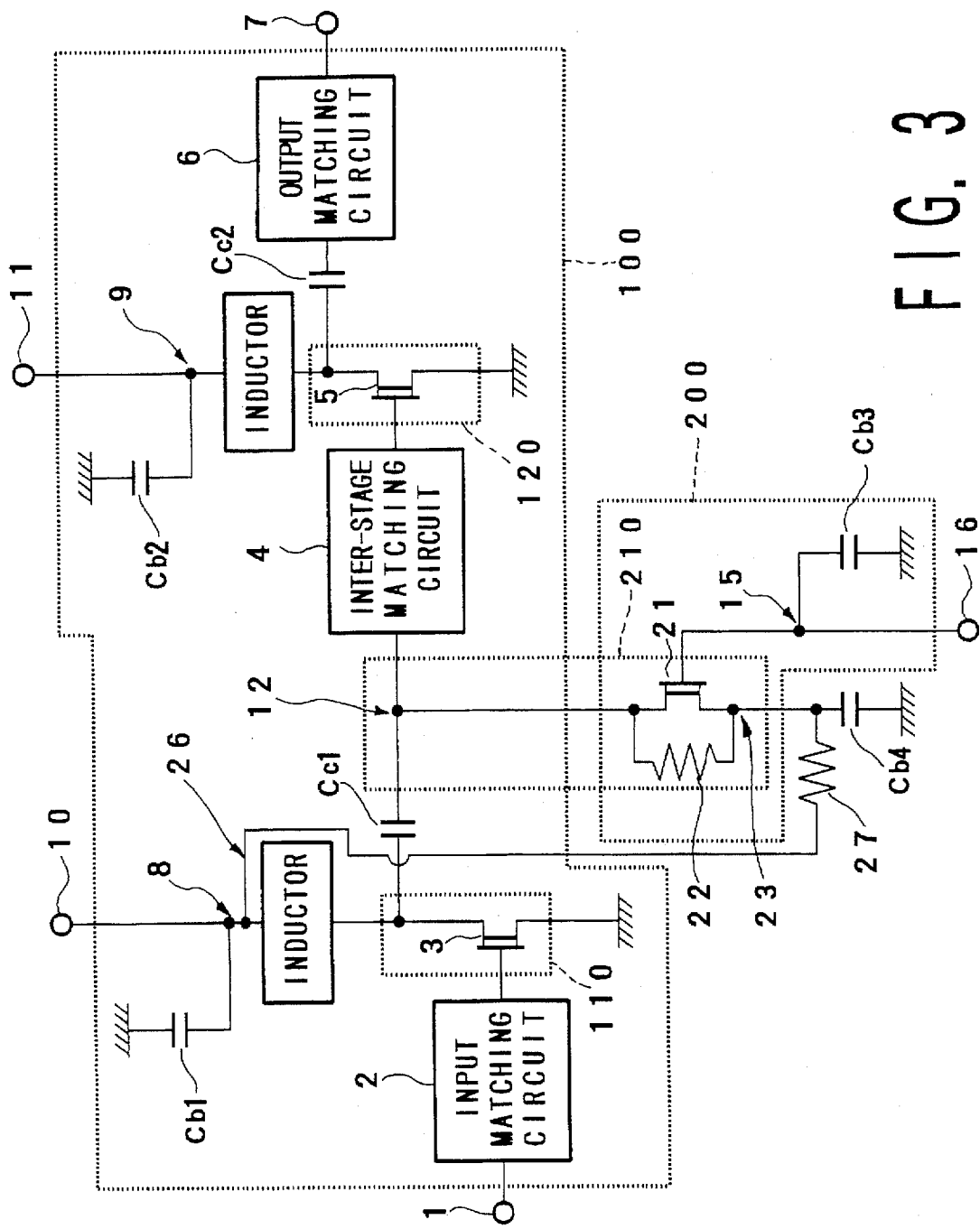
FIG. 3 is a circuit diagram showing a third embodiment of the variable gain high-frequency power amplifier according to the present invention.
Figure 3A:
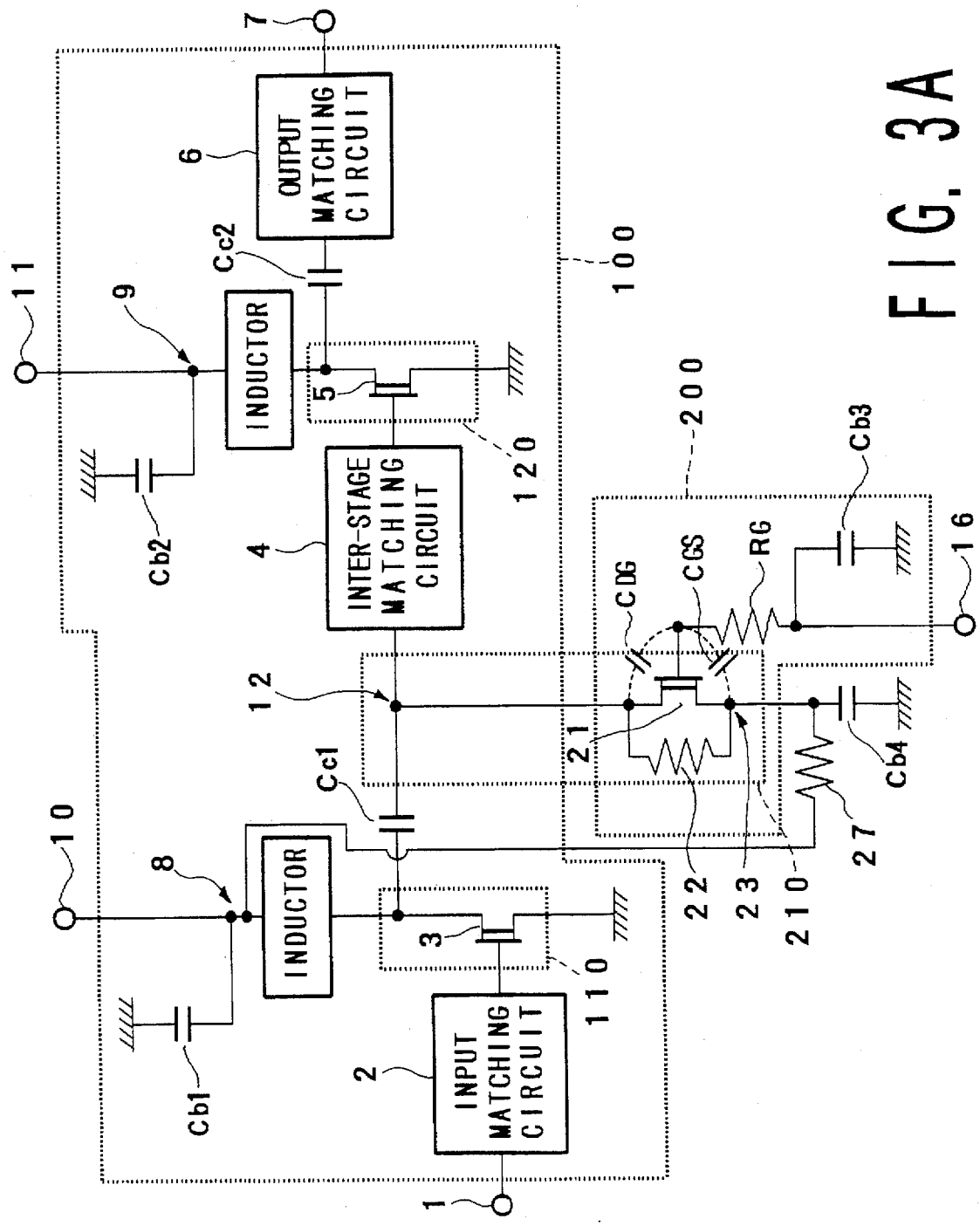
FIG. 3A is a circuit diagram showing a modification of the third embodiment of the variable gain high-frequency power amplifier according to the present invention.

As shown in FIG. 3, in this third embodiment of the variable gain high-frequency power amplifier according to the present invention, it is possible to reduce the number of the voltage supply terminals, in the same way as with the case of the second embodiment, while simplifying the system construction.

As already explained in the description of the second embodiment, when the voltage supply terminal 25 (shown in FIG. 1) of the MESFET 21 is connected to the voltage supply terminal 10 of the MESFET 3 for use in common, there exists a problem in that the circuit may be oscillated.

In this third embodiment, however, it is possible to prevent the circuit from being oscillated, even if the voltage supply terminal of the MESFET 21 is connected in common with the voltage supply terminal 10 of the MESFET 3.

In more detail, as shown in FIG. 3, the node 23 between the source of the MESFET 21 and the high resistance element 22 is connected to the node 8 (AC-grounded by the bypass capacitor Cb1) via a wire 26. Further, a high resistance element 27 is connected midway of the wire 26. In this third embodiment, since the high resistance element 27 is connected, even if both the voltage supply terminals of the two MESFETs 3 and 21 are used in common, it is possible to prevent the output power of the MESFET 3 from being returned to the voltage supply terminal 10 of the MESFET 3. That is, since the positive feedback can be prevented, it is possible to prevent the circuit from being oscillated. Further, the resistance value of the high resistance element 27 is set to the order of kilo-ohms (e.g., 10 kΩ).

A fourth embodiment of the variable gain high-frequency power amplifier will be described hereinbelow with reference to FIG. 4.

In the first to third embodiments, a GaAs semiconductor is used. When the integrated circuit using the GaAs semiconductor is used, there exist such advantages that the high frequency characteristics are excellent and further the operating voltage is low, as compared with the integrated circuit using a silicon semiconductor. On the other hand, however, the cost of the GaAs integrated circuit is higher than that of the silicone integrated circuit.

Therefore, the object of this fourth embodiment is to provide the variable gain high-frequency power amplifier, which can realize the excellent high frequency characteristics at a relatively low operating voltage and at a low cost.

In more detail, as shown in FIG. 4, in this fourth embodiment, the whole amplifier is not formed on the GaAs chip, but the power amplifier is formed being divided into a GaAs chip 300 and an alumina ceramic substrate 400. Here, the GaAs chip 300 is mounted on the alumina ceramic substrate 400. The alumina ceramic substrate 400 (on which the GaAs chip 300 is mounted) is fitted into a package (not shown), and the package (in which the alumina ceramic substrate 400 is fitted) is mounted on a circuit board (not shown) as the variable gain high-frequency power amplifier.

On the GaAs chip 300, there are formed the depletion-type MESFET 3 for constructing the first amplification stage 110, a gate bias circuit 150 (omitted in FIGS. 1 to 3) for applying a negative bias potential to the gate of the MESFET 3, the inter-stage matching circuit 4, the DC block capacitance Cc1 for coupling the inter-stage matching circuit 4 and the first amplification stage 110, the depletion-type MESFET 5 for constructing the second amplification stage 120, another gate bias circuit 160 (omitted in FIGS. 1 to 3) for applying a negative bias potential to the gate of the MESFET 5, the DC block capacitance Cc4 for coupling the gate bias circuit 160 and the inter-stage matching circuit 4, the depletion-type MESFET 21 for constructing the gain control stage 210, and the high resistance element 22 connected between the drain and source of the MESFET 21.

Further, on the alumina ceramic substrate 400, there are formed the input matching circuit 2 connected to the input terminal 1, the DC block capacitance Cc3 for coupling the input matching circuit 2 and an input pad of the GaAs chip 300, the output matching circuit 6 connected to the output terminal 7, the DC block capacitance Cc2 for coupling the output matching circuit 6 and an output pad of the GaAs chip 300, a bypass capacitance Cb1 for AC-grounding a junction point between the drain of the MESFET 3 (via the inductor) and the voltage supply terminal 10, a bypass capacitance Cb2 for AC-grounding a junction point between the drain of the MESFET 5 (via the inductor) and the voltage supply terminal 11, a bypass capacitance Cb3 for AC-grounding a junction point between the gate of the MESFET 21 and the gain control terminal 16, a bypass capacitance Cb4 for AC-grounding a junction point between a node 23 (between the drain of the MESFET 21 and the high resistance element 22) and the voltage supply terminal 11, a bypass capacitance Cb5 for AC-grounding a junction point between the respective low-potential side resistances of the two gate bias circuits 150 and 160 and a gate bias voltage supply terminal 28, and a ground wire 30 for connecting the respective ground pads of the GaAs chip 300 to a ground terminal 29.

Further, in this fourth embodiment, in order to reduce the number of the terminals, a wire 31 connected to the voltage supply terminal 11 is formed on the alumina ceramic substrate 400. To the wire 31, the point 9 AC-grounded via the bypass capacitance Cb2 and the point 24 AC-grounded via the bypass capacitance Cb4 are connected in common.

In the variable gain high-frequency power amplifier as described above, it is possible to form all the elements such as all the bypass capacitances Cb1 to Cb5, a part of the DC block capacitances Cc3 and Cc2, the input matching circuit 2, the output matching circuit 6, and the wire 31 for reducing the number of the terminals, on the alumina ceramic substrate 400. Therefore, the capacitances and the wires each of which occupies a relatively large area can be removed from the GaAs chip 300. Although the GaAs substrate is a costly material, since the area of the GaAs chip 300 can be reduced, the number of chips 300 formed on a single GaAs wafer can be increased, so that the manufacturing cost can be reduced to that extent. In other words, it is possible to provide the variable gain high-frequency power amplifier simplified in the system construction, high in the high frequency characteristics and further low in the power consumption, at a relatively low cost.

A fifth embodiment of the variable gain high-frequency power amplifier will be described hereinbelow with reference to FIG. 5.

In the first to fourth embodiments, the number of the amplification stages is two. Without being limited to only two, the number of the amplification stages can be further increased.

Figure 5:
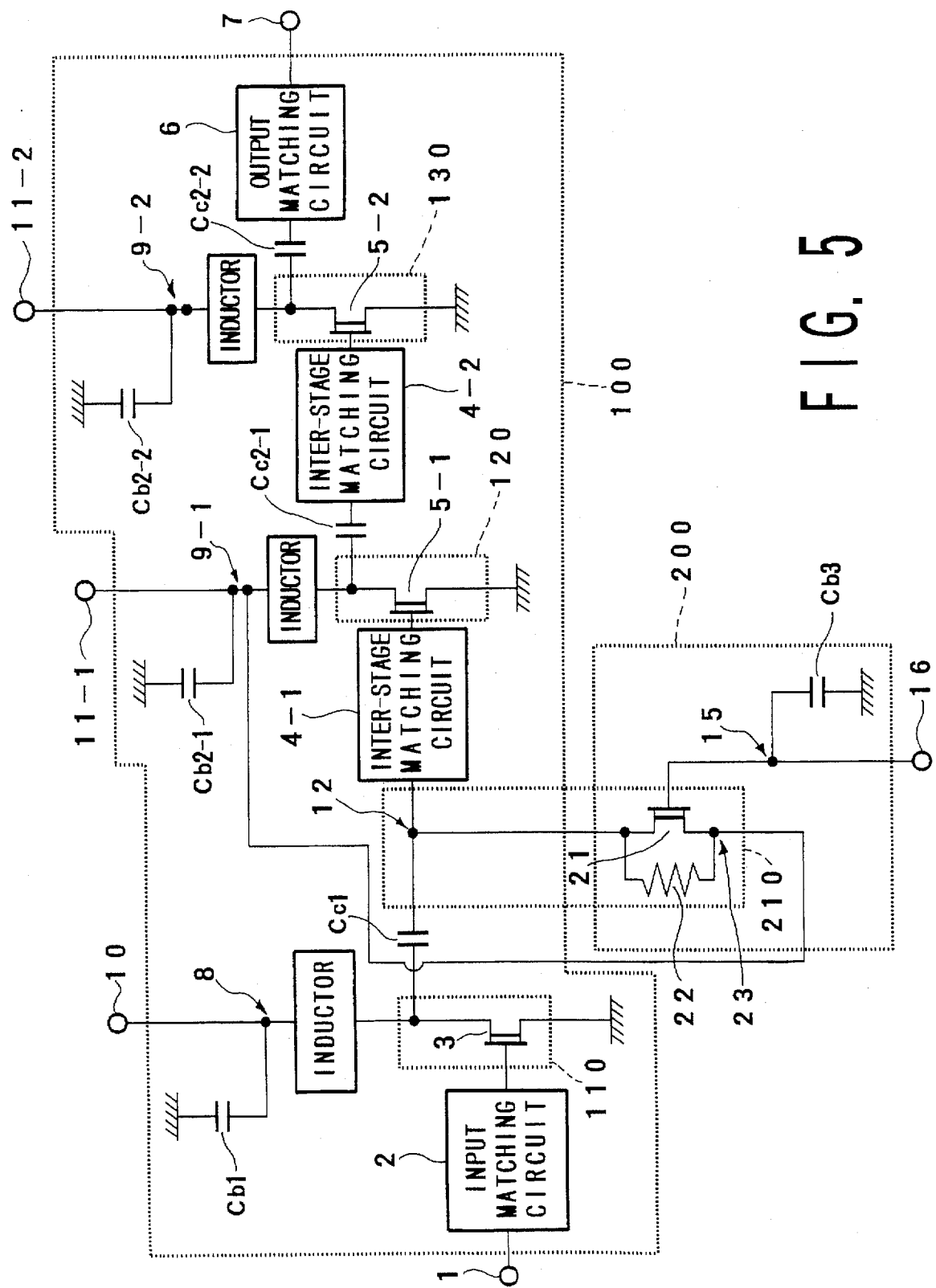
FIG. 5 is a circuit diagram showing a fifth embodiment of the variable gain high-frequency power amplifier according to the present invention.
Figure 5A:
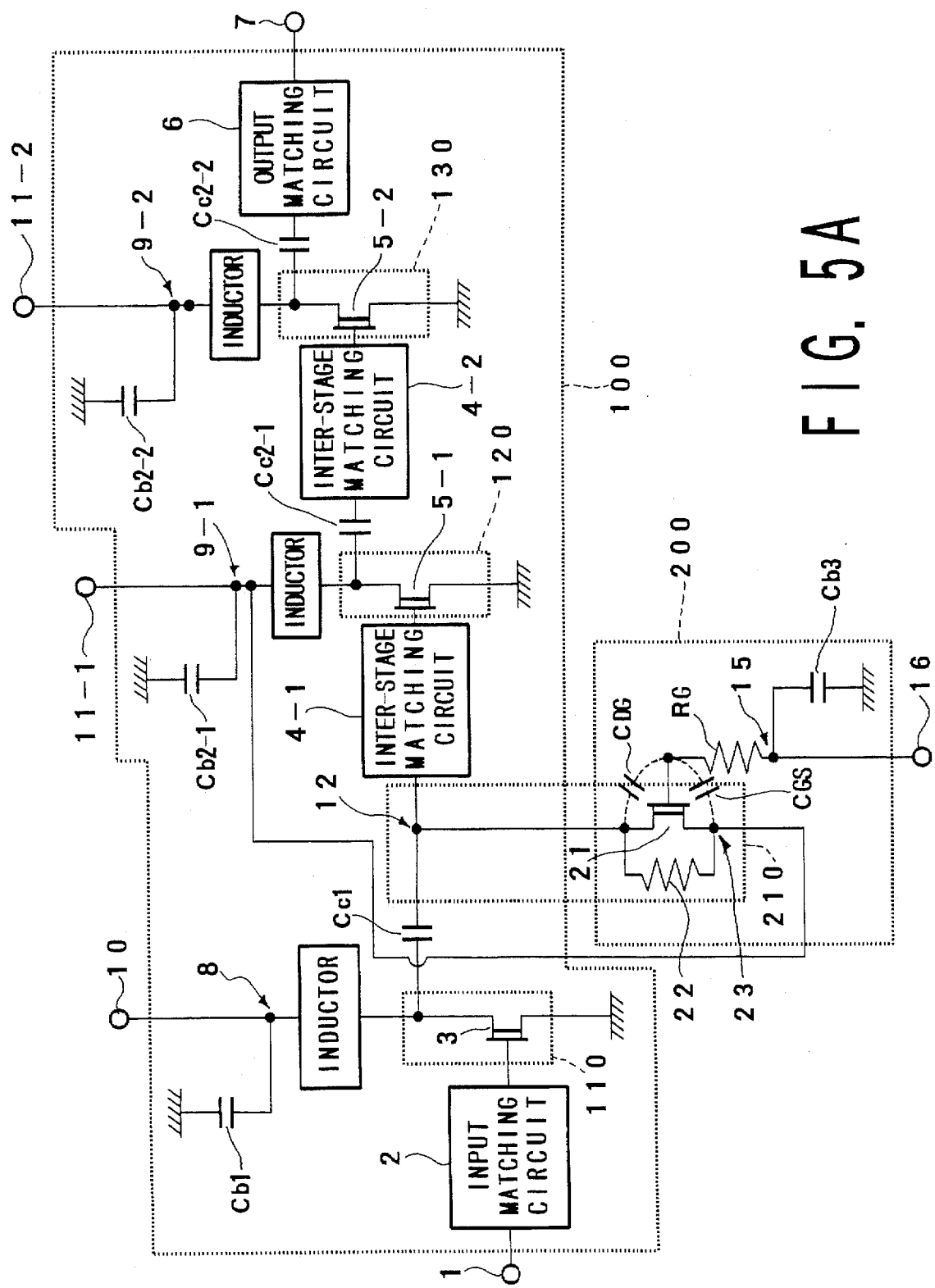
FIG. 5A is a circuit diagram showing a modification of the fifth embodiment of the variable gain high-frequency power amplifier according to the present invention.

As shown in FIG. 5, in this fifth embodiment, the power amplifier is provided with three amplification stages of the first amplification stage 110, the second amplification stage 120 and a third amplification stage 130. Further, the gain control stage 210 is provided between the first and second amplification stages 110 and 120.

Although the gain control stage 210 can be connected between the second and third amplification stages 120 and 130, it is preferable to connect the gain control stage 210 between the first and second amplification stages 110 and 120, as shown in FIG. 5, for the reason as follows:

In the high-frequency power amplifier, the output power is increased in the order of the first, second and third amplification stages 110, 120 and 130 in sequence, so that a relatively large power is handled by the final amplification stage (the third stage 130, in this embodiment). As a result, the size of the MESFET 5-2 of the final stage 130 is large. In contrast with this, the output power handled by the first amplification stage (the first stage 110 in this embodiment) is smaller than that handled by the final amplification stage. As a result, the size of the MESFET 3 of the first stage 110 is smaller than that of the final stage MESFET 5-2. In other words, when the gain control stage 210 is connected between the first and second amplification stages 110 and 120, it is possible to reduce the power to be handled by the MESFET 21 for constructing the gain control stage 210, so that the size of the MESFET 21 can be also reduced. With a result, the area of the GaAs chip can be reduced, and thereby the manufacturing cost thereof can be reduced to that extent.

Further, in the fifth embodiment of the variable gain high-frequency power amplifier, in order to prevent the number of the terminals from being increased, the voltage supply terminal of the MESFET 21 is connected in common to the voltage supply terminal 11-1 of the second amplification stage 120 (MESFET 5-1).

Further, although it is possible to prevent the number of the terminals from being increased by connecting the voltage supply terminal of the MESFET 21 in common to the voltage supply terminal 11-2 of the third amplification stage 130 (MESFET 5-2), it is preferable to connect the voltage supply terminal of the MESFET 21 in common to the voltage supply terminal of the amplifier stage immediately after the gain control stage 210 (the second amplification stage 120 (MESFET 5-1) in FIG. 5), for the following reason.

The power amplifier according to the present invention can be preferably assembled on a circuit board of the portable unit. Here, since the portable unit is often brought into contact with the human body (as compared with fixed units), there exists a high possibility that static electricity is applied to the portable unit.

Here, if a surge voltage is applied from the side of the third amplification stage 130 of a large power into the power amplifier, the applied surge voltage of a large power may be introduced into the power amplifier. Therefore, when the voltage supply terminal of the MESFET 21 is connected in common to the voltage supply terminal 11-2 of the third amplification stage 130 (MESFET 5-2) and in addition when the size of the MESFET 21 is relatively small, there exists such a possibility that a surge voltage of a high power is applied to the MESFET 21, with the result that the MESFET 21 of the power amplifier may be damaged by the high power surge voltage. In contrast with this, the power to be handled by the second amplification stage 120 is smaller than that handled by the third amplification stage 130, so that the surge introduced into the power amplifier from the second amplification stage 120 is smaller than that introduced into the power amplifier from the third amplification stage 130. As a result, when the voltage supply terminal of the MESFET 21 is connected in common to the supply voltage terminal of the amplification stage immediately after the gain control stage, it is possible to reduce the possibility that the power amplifier may be damaged by an unexpected surge voltage, with the result that the reliability of the variable gain high-frequency power amplifier can be increased.

A sixth embodiment of the variable gain high-frequency power amplifier will be described hereinbelow with reference to FIG. 6.

In the second to fifth embodiments, the number of the amplifier terminals is reduced one by connecting the voltage supply terminal of the depletion-type MESFET 21 included in the gain control circuit in common to the voltage supply terminal of the other MESFET of the power amplifier.

In the this sixth embodiment of the variable gain high-frequency power amplifier, the number of the voltage supply terminals of the power amplifier is further reduced two or more, as compared with the number of the voltage supply terminals of the second to fifth embodiments of the power amplifier.

Figure 6:
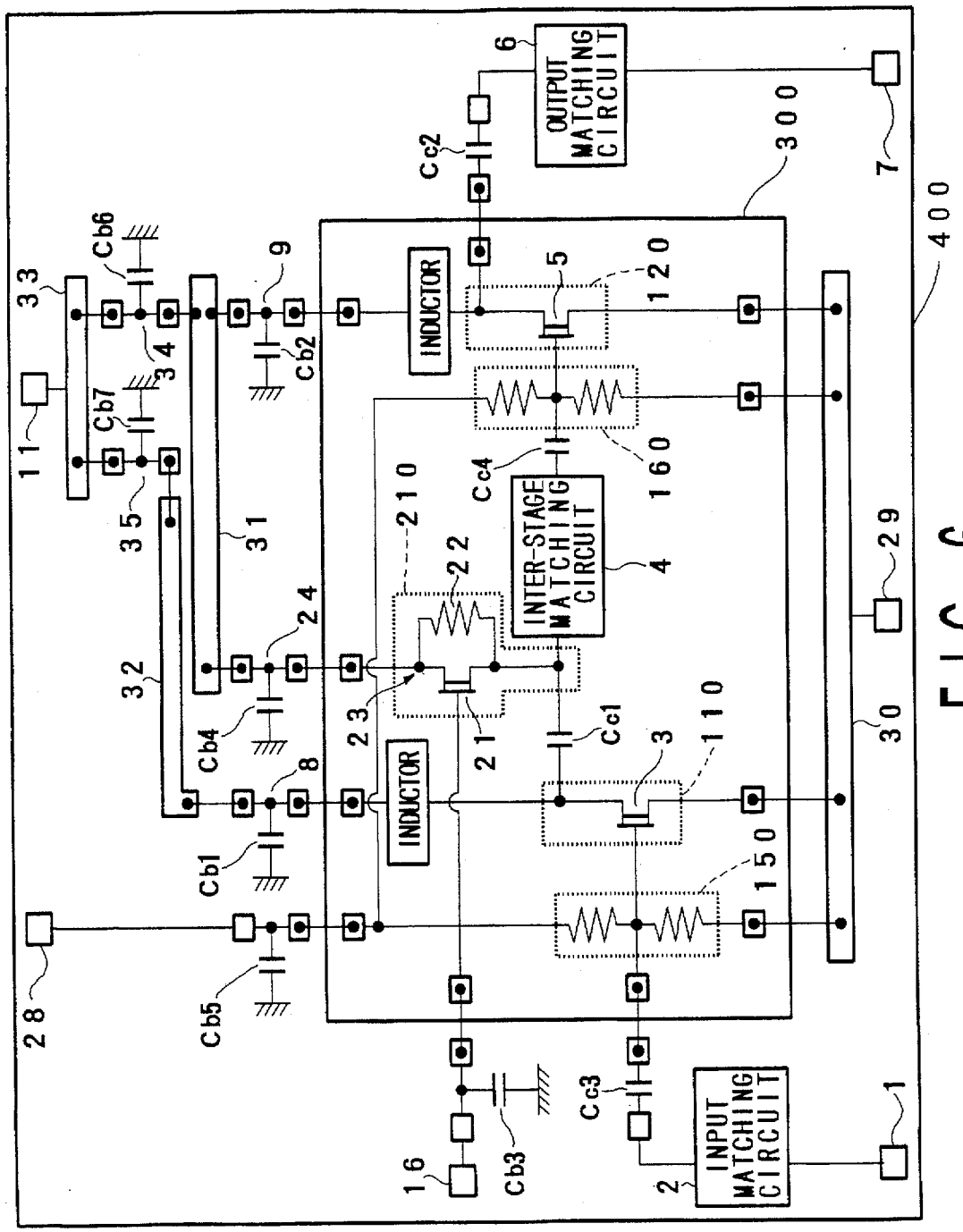
FIG. 6 is a circuit diagram showing a sixth embodiment of the variable gain high-frequency power amplifier according to the present invention.
Figure 6A:
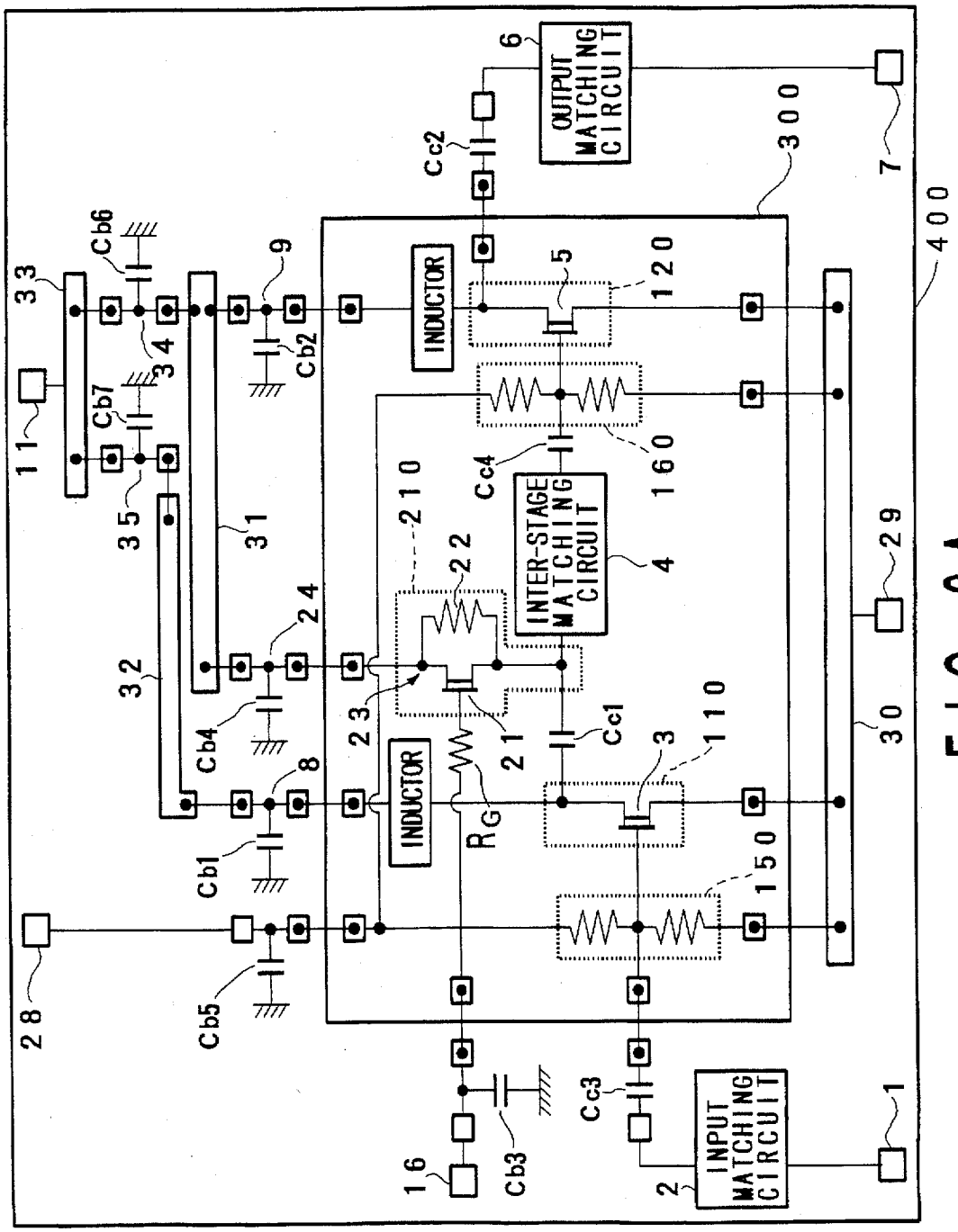
FIG. 6A is a circuit diagram showing a modification of the sixth embodiment of the variable gain high-frequency power amplifier according to the present invention.

As shown in FIG. 6, on the alumina ceramic substrate 400, there are formed the wire 31 connected between the point 9 AC-grounded via the bypass capacitance Cb2 and the point 24 AC-grounded via the bypass capacitance Cb4, and a wire 32 connected to the point 8 AC-grounded via the bypass capacitance Cb1 and further isolated from the wire 31. Further, the wire 32 is connected to a point AC-grounded via a bypass capacitance Cb7.

Furthermore, on the alumina ceramic substrate 400 of this sixth embodiment, an additional wire 33 connected to the voltage supply terminal 11 is formed to connect a point 34 AC-grounded via the bypass capacitance Cb6 and a point 35 AC-grounded via the bypass capacitance Cb7 in common.

In the variable gain high-frequency power amplifier as constructed above, the voltage supply terminal of the depletion-type MESFET 21 for constructing the gain control stage 210 and the voltage supply terminal of the MESFET 5 for constructing the second amplification stage 120 are both connected in common to the wire 31 via the two points AC-grounded via the two bypass capacitances Cb2 and Cb4, respectively. Further, the voltage supply terminal of the MESFET 3 for constructing the first amplification stage 110 is connected to the wire 32 via the point 8 AC-grounded via the bypass capacitances Cb1. In addition, the two wires 31 and 32 are both connected in common to the wire 33 via two points 34 and 35 AC-grounded via the bypass capacitances Cb6 and Cb7, respectively. Further, the wire 33 is connected to one supply voltage terminal 11. Therefore, it is possible to connect the voltage supply terminals of the three MESFETs 3, 5 and 21 in common to one voltage supply terminal 11, with the result that two terminals can be reduced in the power amplifier. In other words, in this sixth embodiment, the number of the terminals can be further decreased, as compared with the second to fifth embodiments.

Further, when the voltage supply terminal of the gain control stage 210 (MESFET 21) is directly connected in common to the voltage supply terminal of the first amplification stage 110 (MESFET 3), there exists a possibility of circuit oscillation, as already explained. In this sixth embodiment, however, the voltage supply terminal of the MESFET 21 is connected to the voltage supply terminal of the MESFET 3 by interposing three bypass capacitances Cb4, Cb6 and Cb7, without connecting both the voltage supply terminals directly. Therefore, it is possible to suppress the possibility of the circuit oscillation by connecting both the voltage supply terminals of both the MESFETs 21 and 3 via a plurality of the bypass capacitances.

Further, it is also possible to form the two bypass capacitances Cb2 and Cb4 integral with each other and further form the two bypass capacitances Cb6 and Cb7 integral with each other. In this case, the two bypass capacitances can be further reduced, so that the manufacturing cost of the power amplifier can be further reduced.

Further, when the wires for grounding the grounded-side electrodes of the two bypass capacitances Cb2 and Cb4 and the wires for grounding the grounded-side electrodes of the two bypass capacitances Cb6 and Cb7 are formed on the alumina ceramic substrate 400 separately from each other, it is possible to prevent the circuit form being oscillated further securely.

In the above-mentioned first to sixth embodiments, the power amplifier has been explained on the assumption that there exist no floating capacitances $C_{DG}$ and $C_{GS}$ between the drain and the gate and between the gate and the source of the MESFET 21. In practice, however, there exists the case where these two floating capacitances $C_{DG}$ and $C_{GS}$ cannot be disregarded and thereby neglected. In this case, a high-frequency signal (voltage) is transmitted from the drain to the gate or further from the drain to source via the gate, so that the high-frequency signal (voltage) is transmitted from the drain to the ground via the capacitance Cb3. To overcome this problem, it is preferable to connect a high resistance element $R_G$ midway between the gate of the MESFET 21 and the capacitance Cb3, as shown in FIGS. 1A, 2A, 3A, 4A, 5A, and 6A, respectively. When the high-resistance element $R_G$ is connected, since high-frequency signal (voltage) is not transmitted through the capacitance Cb3, it is possible to suppress the fluctuations of the voltage at the gate of the MESFET 21 and further to remove the fluctuations of the resistance value between the drain and the source of the MESFET 21, so that the normal gain control can be attained.

As described above, in the variable gain high-frequency power amplifier according to the present invention, it is possible to provide the gain control circuit which can satisfy the need of system simplification, and the variable gain high-frequency power amplifier utilizing this gain control circuit. In addition, it is possible to provide the gain control circuit which can reduce the number of external voltage supply terminals, while suppressing the circuit oscillation due to positive feedback, and the variable gain high-frequency power amplifier utilizing this gain control circuit.

What is claimed is:

1. A gain control circuit for controlling gain of a circuit operative on the basis of a positive supply voltage, in accordance with strength of electric power pulled out by the gain control circuit from a control node of the gain-controlled circuit, comprising:

a depletion-type transistor having one end connected to the control node of the gain-controlled circuit, the other end connected to a voltage supply terminal to which an external supply voltage is applied, and a gate terminal connected to a control signal terminal to which an external positive voltage control signal is applied; and voltage applying means connected in parallel to both ends of said depletion-type transistor, for shifting a threshold voltage of said transistor in a positive direction by applying a shift voltage between both the ends of said transistor so that turn-on resistance of said transistor can be controlled on the basis of the positive voltage control signal, the gain of the gain-controlled circuit being controlled by controlling strength of electric power pulled out from the gain-controlled circuit on the basis of the positive voltage control signal.

2. The gain control circuit of claim 1, wherein said voltage applying means is a resistance element, a voltage drop generated when current flows through said resistance element being used as the shift voltage.

3. The gain control circuit of claim 2, wherein the other end of said transistor and the gate terminal of said transistor are both ac-grounded via a bypass capacitance, respectively.

4. The gain control circuit of claim 3, wherein another resistance element is connected between the gate terminal of said transistor and the control signal terminal, to prevent signal from being transmitted from at least one end of said transistor to the gate terminal thereof via a floating capacitance.

5. The gain control circuit of claim 1, wherein the voltage supply terminal for said transistor is used in common for a voltage supply terminal for the gain-controlled circuit.

6. The gain control circuit of claim 4, wherein the voltage supply terminal for said transistor is used in common for a voltage supply terminal for the gain-controlled circuit.

7. A variable gain signal amplifier device having an amplifier circuit and a gain control circuit for controlling gain of the amplifier circuit by controlling strength of electric power pulled out from a control node of the amplifier circuit, both the circuits being operative on the basis of a positive supply voltage respectively, wherein said gain control circuit comprises:

a depletion-type transistor having one end connected to the control node of the amplifier circuit, the other end connected to a voltage supply terminal to which an external supply voltage is applied, and a gate terminal connected to a control signal terminal to which an external positive voltage control signal is applied; and voltage applying means connected in parallel to both ends of said depletion-type transistor, for shifting a threshold voltage of said transistor in a positive direction by applying a shift voltage between both the ends of said transistor so that turn-on resistance of said transistor can be controlled on the basis of the positive voltage control signal, the gain of the amplifier circuit being controlled by controlling strength of electric power pulled out from the amplifier circuit on the basis of the positive voltage control signal.

8. The variable gain signal amplifier device of claim 7, wherein said voltage applying means is a resistance element, a voltage drop generated when current flows through the resistance element being used as the shift voltage.

9. The variable gain signal amplifier device of claim 8, wherein the other end of said transistor and the gate terminal of said transistor are both ac-grounded via a bypass capacitance, respectively.

10. The variable gain signal amplifier device of claim 7, wherein another resistance element is connected between the gate terminal of said transistor and the control signal terminal, to prevent signal from being transmitted from at least one end of said transistor to the gate terminal thereof via a floating capacitance.

11. The variable gain signal amplifier device of claim 7, wherein the voltage supply terminal for said transistor is used in common for a voltage supply terminal for the amplifier circuit.

12. The variable gain signal amplifier device of claim 10, wherein the voltage supply terminal for said transistor is used in common for a voltage supply terminal for the amplifier circuit.

13. The variable gain signal amplifier device of claim 7, wherein the amplifier circuit is constructed as a multi-stage amplifier circuit, and the control node is a node provided after the first-stage amplifier.

14. The variable gain signal amplifier device of claim 3, wherein each amplifier stage of the multi-stage amplifier circuit has a positive voltage supply terminal, respectively; and the voltage supply terminal of said transistor is connected to one of the positive voltage supply terminals of the multi-stage amplifier circuit except that of the first-stage amplifier.

15. The variable gain signal amplifier device of claim 13, wherein each amplifier stage of the multi-stage amplifier circuit has a positive voltage supply terminal, respectively; and the voltage supply terminal of said transistor is connected to the positive voltage supply terminal of the first-stage amplifier.

16. The variable gain signal amplifier device of claim 10, wherein the amplifier circuit is constructed as a multi-stage amplifier circuit, and the control node is a node provided after the first-stage amplifier.

17. The variable gain signal amplifier device of claim 16, wherein each amplifier stage of the multi-stage amplifier circuit has a positive voltage supply terminal, respectively; and the voltage supply terminal of said transistor is connected to one of the positive voltage supply terminals of the multi-stage amplifier circuit except that of the first-stage amplifier.

18. The variable gain signal amplifier device of claim 16, wherein each amplifier stage of the multi-stage amplifier circuit has a positive voltage supply terminal, respectively; and the voltage supply terminal of said transistor is connected to the positive voltage supply terminal of the first-stage amplifier.

* * * * *